United States Patent
Kurczveil et al.

(10) Patent No.: US 10,897,119 B1
(45) Date of Patent: Jan. 19, 2021

(54) TEMPERATURE SENSOR INTEGRATED WITH MOS CAPACITOR FOR STABILIZING LASERS

(71) Applicant: HEWLETT PACKARD ENTERPRISE DEVELOPMENT LP, Houston, TX (US)

(72) Inventors: Geza Kurczveil, Santa Barbara, CA (US); Di Liang, Santa Barbara, CA (US); Zhihong Huang, Palo Alto, CA (US); Xiaoge Zeng, Palo Alto, CA (US); Raymond G. Beausoleil, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/570,830

(22) Filed: Sep. 13, 2019

(51) Int. Cl.
  *H01S 3/13* (2006.01)
  *H01S 5/0687* (2006.01)
  (Continued)

(52) U.S. Cl.
  CPC .......... *H01S 5/0687* (2013.01); *G01J 1/0414* (2013.01); *H01S 5/021* (2013.01); *H01S 5/0208* (2013.01);
  (Continued)

(58) Field of Classification Search
  CPC .... H01S 5/0687; H01S 5/0208; H01S 5/0261; H01S 5/06808; H01S 5/1096;
  (Continued)

(56) References Cited

U.S. PATENT DOCUMENTS 5,977,565 A * 11/1999 Ishikawa ................. H01L 27/15
  257/81
6,040,590 A  3/2000 OBrien et al.
(Continued)

OTHER PUBLICATIONS

Chen, X. et al., Active Transmission Control Based on Photonic-crystal Mos Capacitor, Proc. SPIE 6480, Photonic Crystal Materials and Devices VI, Feb. 6, 2007, https://www.spiedigitallibrary.org/conference-proceedings-of-spie/6480/1/Active-transmission-control-based-on-photonic-crystal-MOS-capacitor/10.1117/12.705613.short?SSO=1, website accessed Jun. 17, 2019, 3 pgs.
(Continued)

*Primary Examiner* — Kinam Park
(74) *Attorney, Agent, or Firm* — Sheppard Mullin Richter & Hampton LLP

(57) ABSTRACT

Techniques and circuitry for a semiconductor laser with enhanced lasing wavelengths stabilization are described. A semiconductor laser can generate an optical signal (e.g., single or multi-wavelength), for use in a Dense Wavelength Division Multiplexing (DWDM) interconnect system. The stabilization circuitry can include temperature sensor circuitry that measures an operational temperature of the semiconductor laser, and a feedback controller that can determine a temperature-induced wavelength shift that may be experienced by the multi-wavelength optical signal based on the laser's temperature. The feedback controller is also configured to generate a compensation signal that is determined to cause a complimentary shift in the multi-wavelength optical signal, where the complimentary shift can compensate for the temperature-induced wavelength shift. An integrated MOS capacitor of the laser can be charged by the signal in a manner that effectuates the complimentary shift and tunes the multi-wavelength optical signal to compensate for temperature-induced shift, thereby enhancing stabilization.

20 Claims, 11 Drawing Sheets

(51) Int. Cl.

| | |
|---|---|
| *H01S 5/068* | (2006.01) |
| *H01S 5/026* | (2006.01) |
| *H01S 5/02* | (2006.01) |
| *H01S 5/10* | (2006.01) |
| *G01J 1/04* | (2006.01) |
| *H01S 5/0683* | (2006.01) |
| *H01S 5/06* | (2006.01) |
| H04J 14/02 | (2006.01) |
| H04B 10/69 | (2013.01) |
| H04B 10/079 | (2013.01) |
| G01K 7/16 | (2006.01) |
| G01J 5/20 | (2006.01) |
| G01J 5/08 | (2006.01) |
| H04B 10/50 | (2013.01) |
| H01S 5/343 | (2006.01) |

(52) U.S. Cl.
CPC .......... *H01S 5/0261* (2013.01); *H01S 5/0612* (2013.01); *H01S 5/06804* (2013.01); *H01S 5/06808* (2013.01); *H01S 5/06837* (2013.01); *H01S 5/1042* (2013.01); *H01S 5/1096* (2013.01); *G01J 5/0803* (2013.01); *G01J 5/20* (2013.01); *G01K 7/16* (2013.01); *H01S 5/343* (2013.01); *H04B 10/07955* (2013.01); *H04B 10/503* (2013.01); *H04B 10/691* (2013.01); *H04J 14/02* (2013.01)

(58) Field of Classification Search
CPC .... H01S 5/021; H01S 5/0612; H01S 5/06804; H01S 5/06837; H01S 5/343
See application file for complete search history.

(56) References Cited

U.S. PATENT DOCUMENTS

| | | | |
|---|---|---|---|
| 6,330,253 | B1 | 12/2001 | Tuganov et al. |
| 6,987,910 | B2 | 1/2006 | Shappir et al. |
| 7,711,021 | B2 | 5/2010 | Nishiyama |
| 8,195,011 | B2 | 6/2012 | Goldring et al. |
| 2012/0146646 | A1* | 6/2012 | Manipatruni ............ A61B 6/56 324/322 |
| 2015/0348702 | A1* | 12/2015 | Yen .................. H01F 27/32 336/150 |
| 2016/0238860 | A1* | 8/2016 | Liang ................ G02B 6/29395 |
| 2017/0212368 | A1* | 7/2017 | Liang .................. G02F 1/3133 |
| 2017/0317466 | A1* | 11/2017 | Huang .................. H01L 29/78 |
| 2019/0310422 | A1* | 10/2019 | Seyedi ................ H04B 10/572 |
| 2020/0075664 | A1* | 3/2020 | Azize .................. H01S 5/0609 |

OTHER PUBLICATIONS

Picture, Work Package 2—Hybrid III-V/Si building blocks for PICs, http://picture-h2020.eu/index.php/project-overview/work-package-2-hybrid-iii-v-si-building-blocks-for-pics, website accessed Jun. 17, 2019, 6 pgs.

* cited by examiner

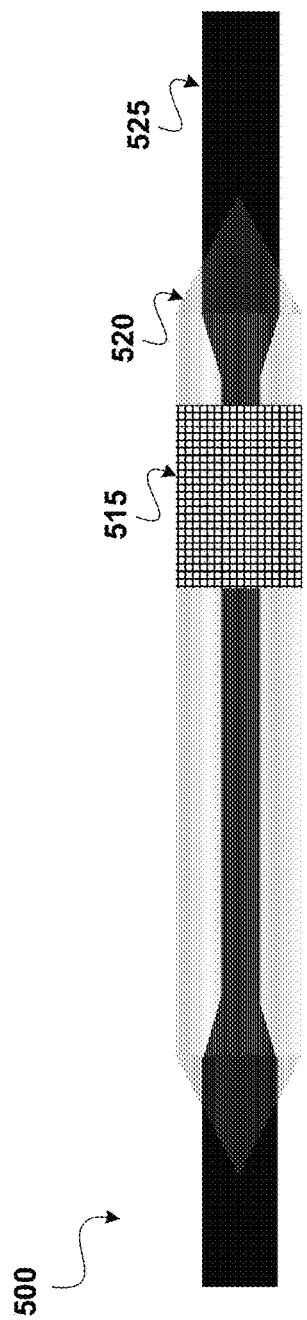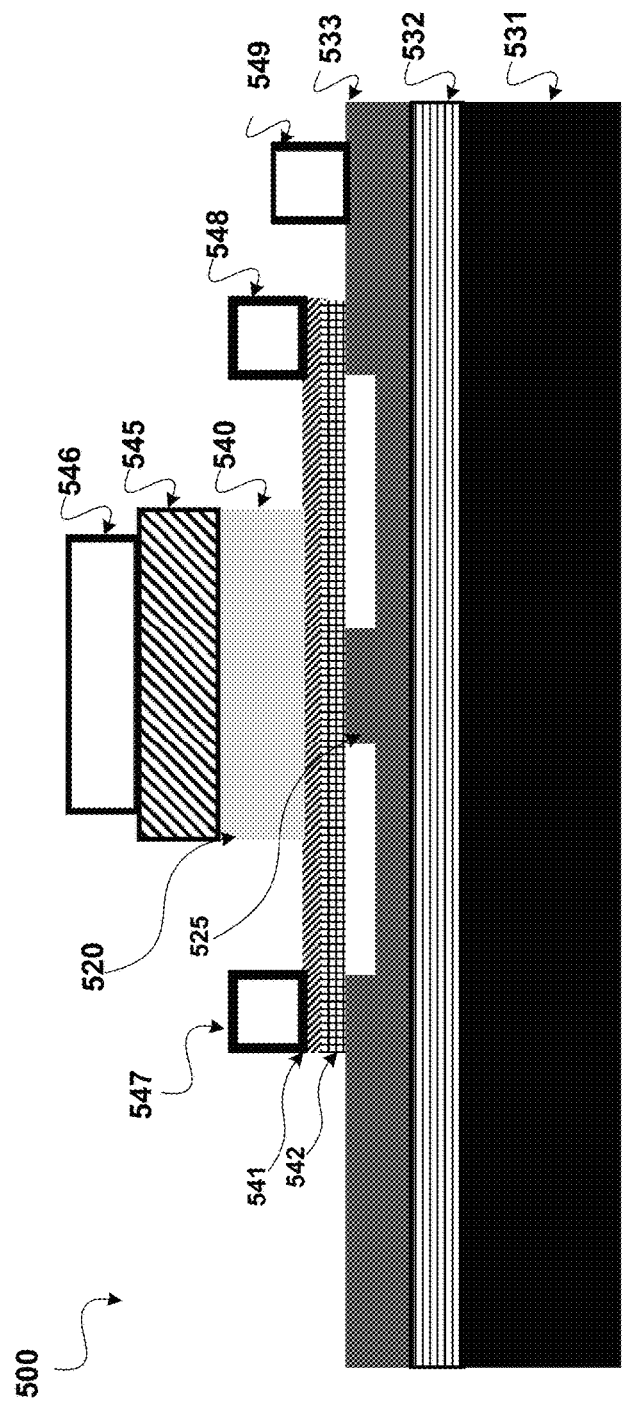

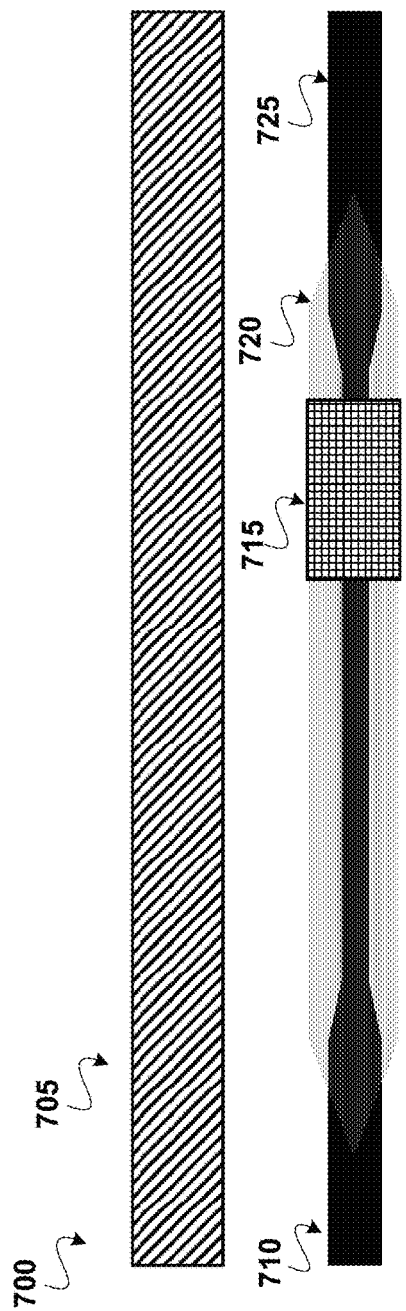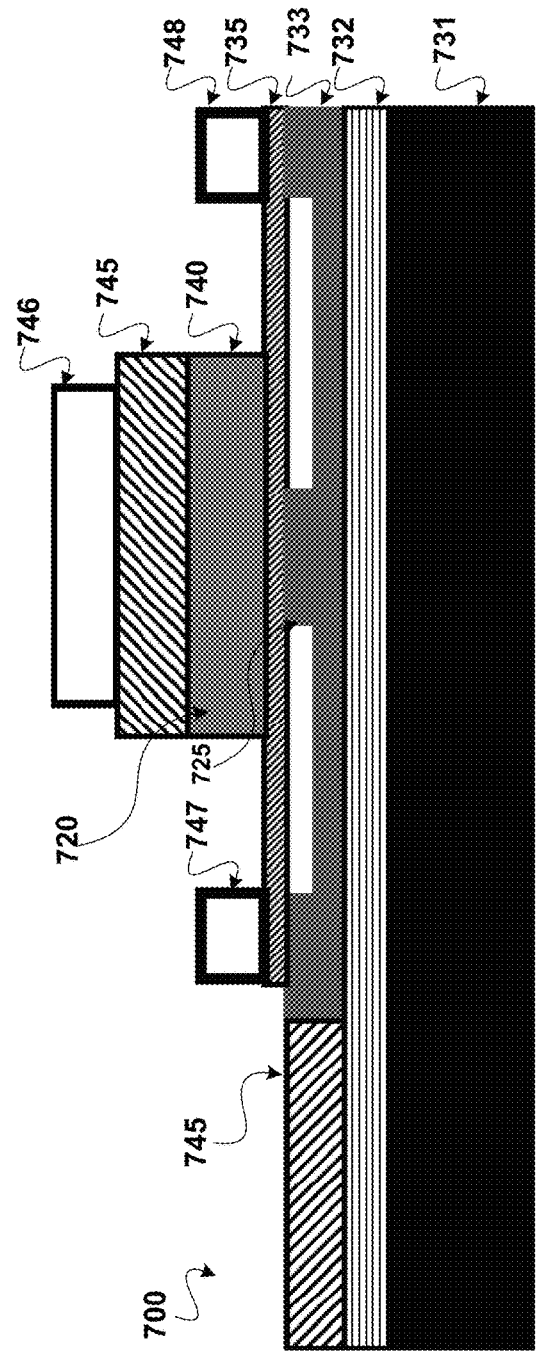
FIG. 7A
FIG. 7B

TEMPERATURE SENSOR INTEGRATED WITH MOS CAPACITOR FOR STABILIZING LASERS

DESCRIPTION OF RELATED ART

Dense Wavelength Division Multiplexing (DWDM) is an optical multiplexing technology that can be used to increase bandwidth over existing fiber networks. DWDM typically consists of combining and transmitting multiple signals simultaneously, at different wavelengths, on the same fiber, thus multiplying the capacity of the physical medium. DWDM interconnects using nanophotonics, in general, can offer orders of magnitude improved bandwidth and energy efficiency over electrical interconnects. Emerging multi-core computing systems, which often require an interconnect fabric that provides high throughput at low power with a small footprint, may lend themselves to employ DWDM technology.

Typically, optical systems, such as DWDM, employ lasers to generate optical signals. Typical semi-conductor lasers can emit photons based on recombining positive electrical carriers in an active region. In the case of electrically driven lasers, this process is in response to generating a current through respective positive and negative doped regions and metal electrodes in the laser.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 5A illustrates a top view of an example schematic for a semiconductor laser, for example the laser depicted in FIG. 1A, where the semiconductor laser includes an integrated metal-oxide semiconductor (MOS) capacitor capable of the disclosed wavelength shift compensation techniques, according to some embodiments.

FIG. 5B illustrates a cross-sectional view of an example schematic for a semiconductor laser, for example the laser depicted in FIG. 1A, where the semiconductor laser includes an integrated MOS capacitor capable of the disclosed wavelength shift compensation techniques, according to some embodiments.

FIG. 7A illustrates a top view of an example schematic for a semiconductor laser, for example the laser depicted in FIG. 1A, where the semiconductor laser includes a resistor (e.g., temperature sensor) of the stabilization circuitry, according to some embodiments.

FIG. 7B illustrates a cross-sectional view of an example schematic for a semiconductor laser, for example the laser depicted in FIG. 1A, where the semiconductor laser includes a resistor (e.g., temperature sensor) of the stabilization circuitry, according to some embodiments.

Figure 1A:
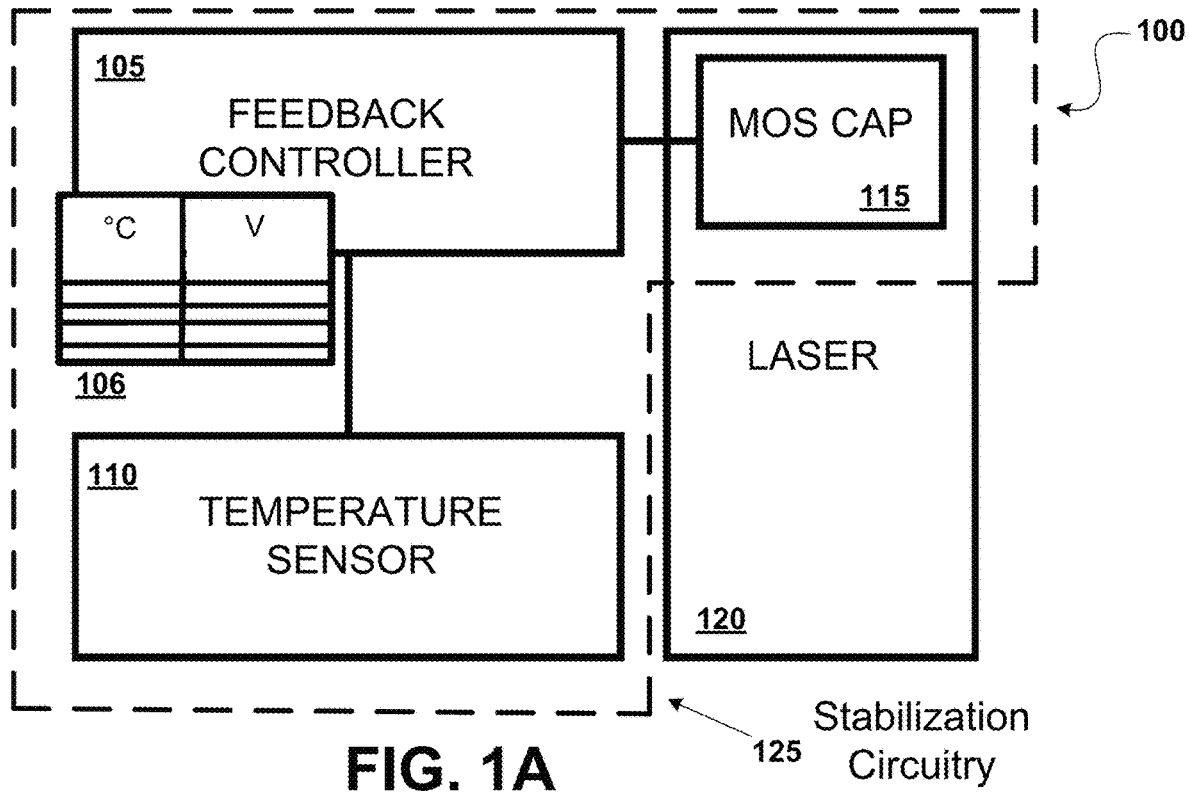
FIG. 1A is a conceptual diagram of an example of an optical transmitter, including a semiconductor laser, with stabilization circuitry, wherein the stabilization circuitry includes an external temperature sensor and feedback controller for implementing wavelength shift compensation, according to some embodiments.

The figures are not exhaustive and do not limit the present disclosure to the precise form disclosed.

DETAILED DESCRIPTION

Various embodiments described herein are directed to an optical transmitter, including a semiconductor laser and having circuitry that compensates for an unintended shift in the lasing wavelength(s), for example a temperature-induced wavelength shift. Thus, the disclosed laser can realize improved stabilization of the lasing wavelength(s) produced by the semiconductor laser during operation. An operational temperature of a semiconductor laser can increase over the life of the device, in many cases as a result of other components that are in close proximity to the laser, as well as other material effects. Often times, the rise in temperature that is experienced by typical semiconductor lasers, in turn, causes unintended changes in the laser's lasing wavelength. For instance, wavelengths of an optical signal tend to increase with respect to an increase in operational temperature at the laser (assuming operation of the laser remains otherwise consistent). Restated, a semiconductor laser may be set to emit light at specific wavelengths, for instance being set to the resonant wavelengths of modulators in a Dense Wavelength Division Multiplexing (DWDM) system. However, as temperature at the laser rises, the lasing wavelengths that are actually generated by the laser are likely to experience an unintended shift, resulting in longer wavelengths (e.g., as compared to the target wavelengths) being output by the laser.

The disclosed stabilization circuitry can include a temperature sensor for measuring an operational temperature of the semiconductor laser. As alluded to above, the laser's temperature can be indicative of temperature-inducted wavelength shift (also referred to herein as or unintended wavelength shift or red shift). Consequently, obtaining a temperature measurement can serve as a signal to the circuitry to initiate dynamic compensation techniques, adjusting for the assumed shift. Additionally, the disclosed stabilization circuitry can include a feedback controller that initiates the compensation techniques, adjusting the lasing wavelength(s) to correct for any unintentional shift, as sensed by the circuitry (e.g., based on the measured temperature).

As referred to herein, "red shift" and "blue shift" describe how light shifts toward longer or shorter wavelengths, respectively. Visible light is a spectrum of colors, and with respect to this spectrum, light is shifted to the red end of the spectrum, as its wavelengths gets longer. If an object moves closer, the light moves to the blue end of the spectrum, as its wavelengths get shorter. Thus, a red shift generally refers to an increase in wavelength, while a blue shift conversely refers to a decrease in wavelength. Conventional lasers will typically experience red shift as a result of various phenomena, such as the increase of injection current, decrease of carriers, or increase of temperature. Conversely, properties of metal-oxide semiconductor (MOS) capacitors have been discovered to cause a laser to blue shift when they are biased in a way to cause carrier accumulation around this MOS capacitor, having the wavelengths of the laser move towards the shorter region.

Accordingly, the semiconductor laser includes a MOS capacitor integrated therein (as an element of the stabilization circuitry). According to the embodiments, the MOS capacitor can be dynamically tuned by the feedback controller. By tuning the MOS capacitor to create a blue shift effect in the semiconductor laser, then the laser can be tuned in way that compensates for red shift and achieves stabilization. Particularly, the MOS capacitor can receive a control signal, such as a voltage that drives a determined (or known) wavelength shift of the lasing wavelength(s) to compensate for any unintended wavelength shift. By leveraging the integrated MOS capacitor, the solution is implemented using primarily internal elements (with respect to the laser), as opposed to some conventional laser stabilization approaches that rely on additional devices and/or adjustments that are external to the laser (e.g., tuning modulators to account for wavelength shift). Consequently, the disclosed stabilization circuitry realizes a dynamically tunable, efficient, and cost-effect solution for stabilizing the laser during operation. Even further, by implementing a dynamically adjustable stabilization approach at the laser, the stabilization circuitry allows the laser to continuously self-correct in a manner that mitigates degradation in the laser's function over time.

Referring now to FIG. 1A, a conceptual diagram of an optical transmitter 100 configured to operate with enhanced laser stabilization features is shown. In the illustrated example, the optical transmitter 100 includes a semiconductor laser 120, and can be employed as a light source in a variety of optical systems, such as in optical interconnect systems and optical communication systems. For purposes of discussion, the semiconductor laser 120 of the optical transmitter 100 is described as a multiple-wavelength semiconductor laser. That is, the semiconductor laser 120 may be a laser that produces a spectrum of light having a series of discrete, equally-spaced frequency elements. Alternatively, in some embodiments, the semiconductor laser 120 can also be implemented as a single wavelength semiconductor laser.

Figure 1B:
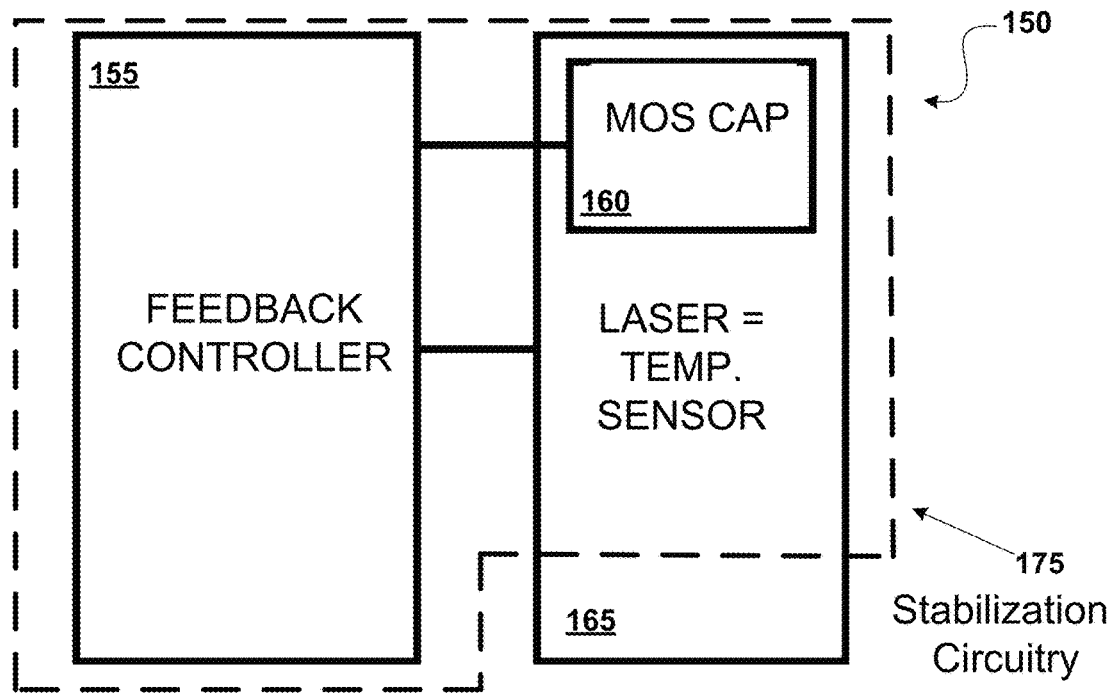
FIG. 1B is a conceptual diagram of another example of an optical transmitter, including a semiconductor laser, having stabilization circuitry, where the stabilization circuitry includes a temperature sensor integrated with the semiconductor laser coupled to an external feedback controller for implementing wavelength shift compensation, according to some embodiments.

In the example of FIG. 1A, the optical transmitter 100 is shown as including several principal elements: semiconductor laser 120; a metal-oxide semiconductor (MOS) capacitor 115 that is integrated into the laser 120; temperature sensor 110; and feedback controller 105. Also, the stabilization enhancing circuitry 125 is shown as a logical grouping (indicated by a dashed-lined box) of the components that collectively function to implement the disclosed stabilization techniques for the laser 120. As described herein the semiconductor laser 120 section of optical transmitter 100 can be considered the portion of circuitry that particularly includes the active region of the laser and generates the light. Particularly, FIG. 1A serves to illustrate that in an example configuration, the temperature sensor 105 can be implemented as a separate component from the semiconductor laser 120. As seen in FIG. 1A, the temperature sensor 110 is an external component (with respect to the laser 120) that is situated proximately adjacent to the semiconductor laser 120. In contrast, FIG. 1B serves to illustrate another example configuration of the stabilization circuitry, where the temperature sensor is integrated into the semiconductor laser. Thus, the stabilization circuitry can be implemented using minimal circuitry (or components) that are external to the semiconductor laser, as seen in FIG. 1A. Even further, the stabilization circuitry can be implemented using circuitry (or components) that are internal to the semiconductor laser, as seen in FIG. 1B.

Referring back to FIG. 1A, an operational temperature of the semiconductor laser 120 can be measured by the temperature sensor 110. As allude to above, FIG. 1A shows that the circuitry can be arranged such that the temperature sensor 110 is positioned in close proximity to the semiconductor laser 120. The temperature sensor 110 can be positioned within 10 μm from the semiconductor laser 120, for example. In some embodiments, the temperature sensor 110 is implemented using a diode. Particularly, in an embodiment, the diode can be a silicon diode, where light having a wavelength of 1.3-1.5 μm that may be emitted from the laser 120 likely has no impact on the (photo) current in the diode. Additionally, the diode can be used in forward bias or reverse bias. While forward bias gives a higher sensitivity to temperature changes, there may be a tradeoff with increased power consumption. With this in consideration, an optimizing design approach can involve operating the diode using a slight forward bias (e.g., approximately ~0.5 V). A property of diodes is having a current-to-voltage relationship that is temperature dependent. This current-to-voltage relationship, as a function of temperature, can be represented mathematically as:

$$I = I_S \left( e^{\frac{qV}{kT}\eta} - 1 \right) \quad (1)$$

where $I_s$ is the reverse bias saturation current,
q is the charge of the electron,
V is the voltage across the diode,
k is the Boltzman constant,
T is the temperature,
n is the diode ideality factor.

Accordingly, measuring a current across the diode can be used to deduce a value T correlating to a temperature at the element. By having a diode placed closely to the laser 120, the temperature sensor 110 can effectively use the diode's temperature as a measurement of the adjacent laser's temperature. Thus, at an instance of measuring the current across the diode, the temperature sensor 110 can also be considered as measuring the temperature that is currently being experienced at the semiconductor laser 120 (at that instance). In some cases, the resistor can be implemented by doping the semiconductor material that is in close proximity of the semiconductor laser 120. Alternatively, a resistor can be implemented by depositing a separate material stack.

Alternatively, the temperature sensor 110 can be implemented as a resistor. Similar to diodes, resistors have properties that can be defined in relation to temperature. For instance, there is a resistance-to-temperature relationship that is known for resistors. This temperature-to-resistance relationship can be represented mathematically as:

$$R = R_{ref}(1+\alpha[T-T_{ref}]) \quad (2)$$

where $R_{ref}$ is the resistance at a reference temperature,
$\alpha$ is the temperature coefficient of resistance,
T is the temperature,
$T_{ref}$ is the reference temperature It should be appreciated that the aforementioned relationship is an example for relating a measurable resistance to resistance, and certain types of resistors (e.g., thermocouples, thermistors, and resistance temperature detectors) have other known temperature-to-relationships that can be employed in the techniques as deemed appropriate. Accordingly, measuring a resistance across the resistor be used to deduce a value T correlating to a temperature at the element. Furthermore, the temperature sensor 110 can effectively use the resistor's temperature as a measurement of temperature at the adjacent semiconductor laser 120. Additionally, in another embodiment, the temperature sensor 110 may be implemented using optical-based component. As an example, a Mach-Zehnder Interferometer (MZI) can be employed to perform the temperature sensing functions described above. An example of the stabilization circuitry including an MZI-based implementation of the temperature sensor 110 is discussed in greater detail in reference to FIG. 9.

FIG. 1A shows that the optical transmitter 100 can include a feedback controller 105. The feedback controller 105 can be implemented as a processing device that is capable of various functions including applying input (signal), receiving feedback based on the input, and performing corresponding calculations, such as processor or controller. In an embodiment, the feedback controller 105 is as a proportional-derivative controller (PID) controller. According to the embodiments, the feedback controller 105 is configured for performing several aspects of the disclosed stabilization circuitry 125, for instance measuring temperature, feedback controller 105 can be similarly determining a wavelength shift (based on temperature), and determining a compensation factor, (e.g., voltage to apply to MOS capacitor 115 to generate blue shift). The compensation factor is a value that is realized as a control signal that is transmitted to the MOS capacitor. For example a voltage value (i.e., compensation factor) can be determined by the feedback controller 105, which is then used to generate a corresponding voltage signal at the value, namely the control signal. Also, FIG. 1A shows that the feedback controller 105 can be implemented as an external component, with respect to the semiconductor laser 120. However, the feedback controller 105 does not have the same proximity considerations as the temperature sensor 110, which require it to be positioned as close to the semiconductor laser 120. For instance, the feedback controller 105 can be have a distance close to 1 mm from the semiconductor laser 120.

As an example, in operation, the feedback controller 105 can apply a current to the temperature sensor 110. Then, the feedback controller can read a measurement of an electrical characteristic, such as voltage, across the temperature sensor 110. In other instances, conversely, the feedback controller 105 can measure temperature by applying a voltage across the sensor, and reading its output current. The feedback controller 105 is configured to determine a temperature, which is considered the sensed temperate of the semiconductor laser 120, from this obtained measurement. Temperature can be calculated, or otherwise determined, based on a mathematic relationships with a measured characteristic, as previously described. As such, data structures that represent these temperature-based relationships (or the mathematical relationships themselves) can be programmed into the feedback controller 105, for instance eq (1) or eq (2). Using these relationships, the feedback controller 105 can derive a value for temperature (based on the output from the temperature sensor 110). In an embodiment, the feedback controller 105 is programmed with a look-up table 106 which defines correlations between a measured value and temperature. For example, the feedback controller 105 can obtain a voltage (measured across the diode of the temperature sensor 110) that can be compared to the look-up-table 106. From the look-up-table 106, it may determine that a known value for temperature corresponds to the measured voltage, where the look-up-table 106 uses the eq (1) to link a voltage (input as V in the equation) to a temperature (calculated T from the equation based on V). In other embodiments, the feedback controller 105 can be configured to perform the computations necessary to calculate a temperature from the measured electrical characteristic, for example implementing eq (1) and eq (2). According to some embodiments, the look-up-table 106 is a data structure that can be stored in a memory of the feedback controller 105 (e.g., dynamic), or preprogrammed into the feedback controller 105 (e.g., static). As such, the feedback controller 105 can read data contained in the look-up-table from its memory, to be employed during the process steps described herein.

Figure 4A:
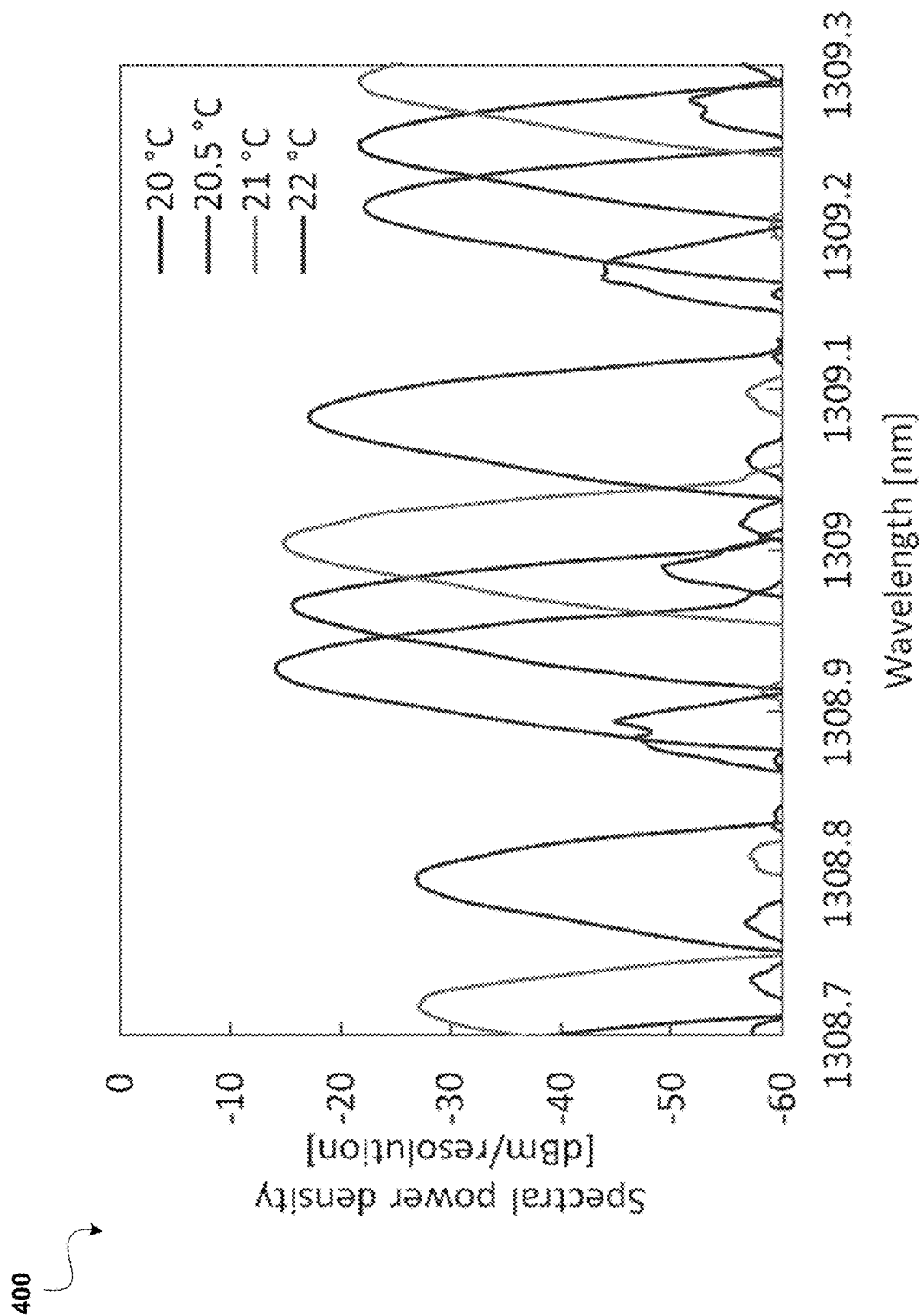
FIG. 4A is a graphical representation of optical spectral power density of a semiconductor laser as a function of wavelength, also illustrating this relationship at varying temperatures.

Furthermore, the feedback controller 105 can be configured to determine an appropriate compensation factor, based on the temperature that is determined using the temperature sensor 110. As mentioned above, a rise in temperature can cause a red shift in the lasing wavelength, where the wavelength(s) output by the semiconductor laser 120 is unintentionally longer than the target output wavelength. FIG. 4A illustrates a graph 400 that provides a graphical representation of the temperature sensitivity of semiconductor lasers. In detail, graph 400 illustrates the spectral power density (y-axis) of a laser as a function of wavelength (x-axis) at different temperatures. Each curve represents the laser's behavior at a particular temperature. In general, the graph 400 shows that the emission wavelength of the laser shifts further to the right, indicative of longer wavelengths, proportionally as the temperature increases. The lasing wavelength of a typical semiconductor laser can change by +0.08 nm per degree (° C.) of increased temperature. Thus, graph 400 represents the temperature-induced red shift phenomenon, as described above.

Figure 4B:
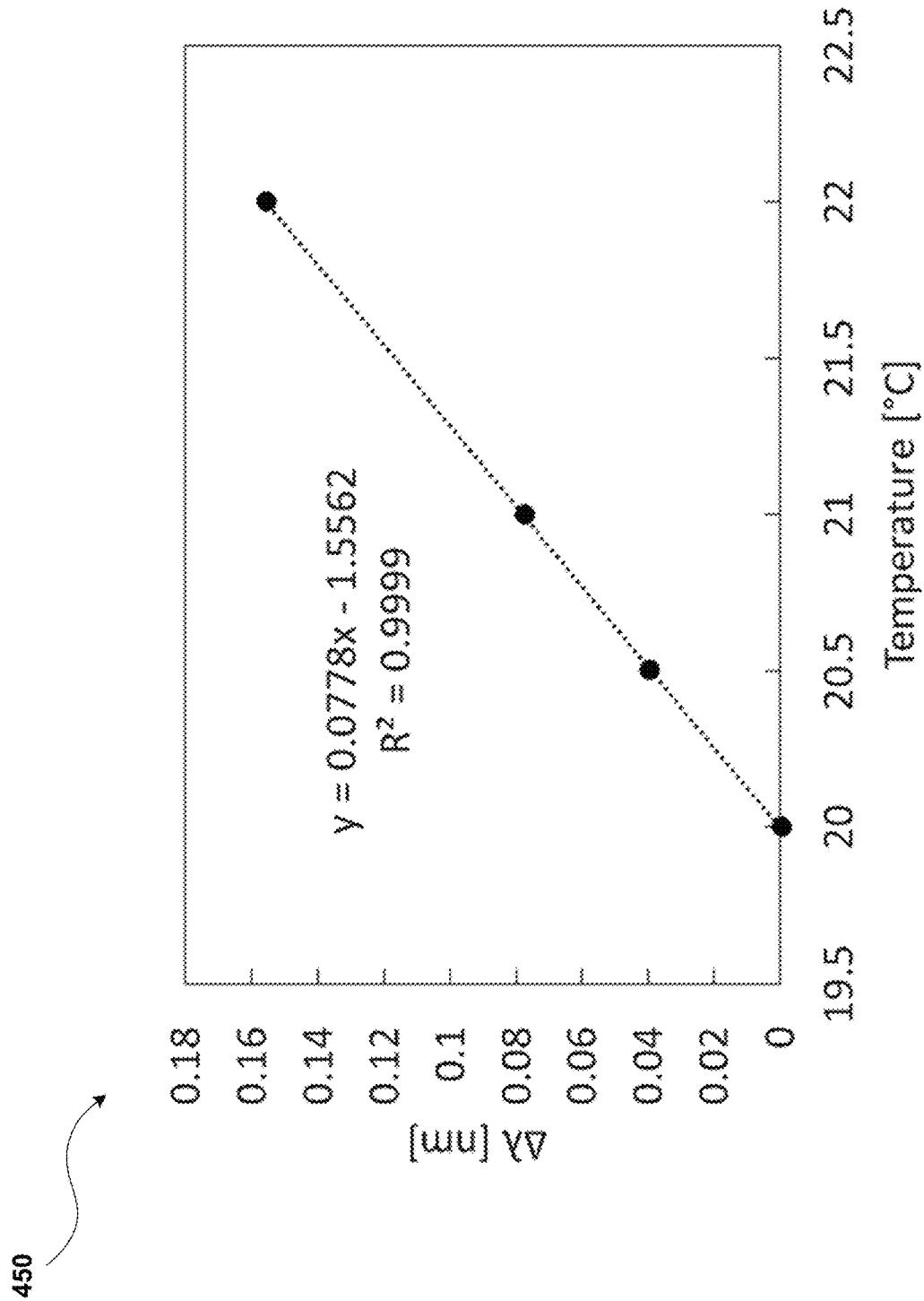
FIG. 4B is a graphical representation of wavelength shift as a function of temperature, thereby illustrating examples of temperature-induced wavelength shift.

In some embodiments, a compensation factor can be a selected amount of voltage that is applied to the semiconductor laser 120 (specifically to the integrated MOS capacitor 115), which will cause a particular amount of blue shift to wavelength(s) at the laser 120. The feedback controller 105 is configured to select an amount of voltage that is determined to produce the required blue shift that is sufficient to offset the potential red shift, thereby tuning the semiconductor laser 120 (and its lasing wavelength) to the target wavelength(s). For instance, the feedback controller 105 can compare the laser's temperature to a set point, such as a point in the graph of FIG. 4B. As alluded to above, a relationship between temperature (° C.) and an amount of red shift, or Δ wavelength (nm), that may be experienced by a typical semiconductor laser is known (e.g., established from experimental data). Thus, as an example, the feedback controller 120 can measure a temperature of 22°, which corresponds to a set point in the known temperature-to-shift relationship indicating a blue shift of approximately 0.16 nm (Δ wavelength=0.16 nm). Accordingly, in a case where the semiconductor laser 120 is set to generate a target wavelength of 1300 nm, heat may likely cause the red shift, and the actual output of the semiconductor laser 120 to be lengthened to a wavelength of 1300.16 nm. The micro-optic devices that are often used in optical transmission systems, such as microrings, can have a high sensitivity which can be impacted by even a slight unintentional shift in wavelength. For instance, a microring resonator having resonance wavelength set to 1300 nm may fail to recognize light emitted by the semiconductor laser 120 at 1300.16 nm wavelength, thereby having a downstream effect on the overall function of the DWDM system. However, to mitigate this problem, the disclosed optical transmitter 100, and particularly the semiconductor laser 120 is enhanced with stabilization, where the feedback controller 105 can take the determined red shift, Δ wavelength (based on the measured temperature) and apply a voltage to the MOS capacitor 115 that is determined to generate an amount of blue shift. The blue shift can decrease (shorten) wavelength(s) generated by the semiconductor laser 120 in manner that effectively cancels out the unintended increase in wavelength(s), or the red shift. In other words, the feedback controller 105 can compensate for a temperature-induced wavelength shift, by applying an appropriate amount of voltage to the MOS capacitor 115 that causes a blue shift that is equal to the determined amount of red shift. Referring back the example, the feedback controller 105 can determine the red shift of 0.16 nm (Δ wavelength=0.16 nm) cause by the rise in temperature, and as a result applies 4 V to the MOS capacitor 115 to effectuate a blue shift that decreases the wavelength by 0.16 nm (e.g., in the case of a typical CMOS circuit, which can support from 0.9V-1.2V voltage). As a result, shifts to higher wavelengths cause by increasing temperature can be compensated by increasing the voltage on the MOS capacitor 115.

Additionally, FIG. 1A illustrates a MOS capacitor 115 that is integrated into semiconductor laser 120. The integration of the MOS capacitor 115 in a semiconductor laser may implement, or otherwise improve, certain aspects the laser's 120 function. In general, integrating the MOS capacitor 115 into the laser 120 can allow for improved control at the laser 120, for instance with respect to tuning to certain wavelengths. Furthermore, according to the embodiments, the MOS capacitor 115 can stabilize the laser 120, such that wavelengths can be fixed to certain grades, and not fluctuate over the temperature. In most cases, the MOS capacitor 115 is capable of tuning the lasing wavelength approximately 2 nm. Thus, in a scenario where the semiconductor laser 120 has a wavelength shift nearing 0.1 nm/° C., the MOS capacitor 115 is able to compensate for the wavelength shift that may occur if the measured temperature of the laser 120 is approximately 20° C.

Referring now to FIG. 1B, the components and functions of the optical transmitter 150 are substantially similar to those described in detail with reference to the laser in FIG. 1A, and are not described again for purposes of brevity. However, as seen FIG. 1B, a temperature sensor is integrated into the semiconductor laser, which is illustrated as laser/temperature sensor 165. As previously described, the disclosed temperature sensor can be implemented using a diode. In FIG. 1B, constructing the semiconductor laser 165 forms a diode that can be leveraged, also being used as the temperature sensor. In other words, a semiconductor laser 165 itself, can already be considered a diode. Accordingly, by employing the integrated temperature sensor design, optical transmitter 150 can realize the stabilization circuitry 175 with an even smaller footprint (as compared to the laser in FIG. 1A) having a single laser/temperature sensor 165 which performs the function of otherwise separate components.

Figure 2A:
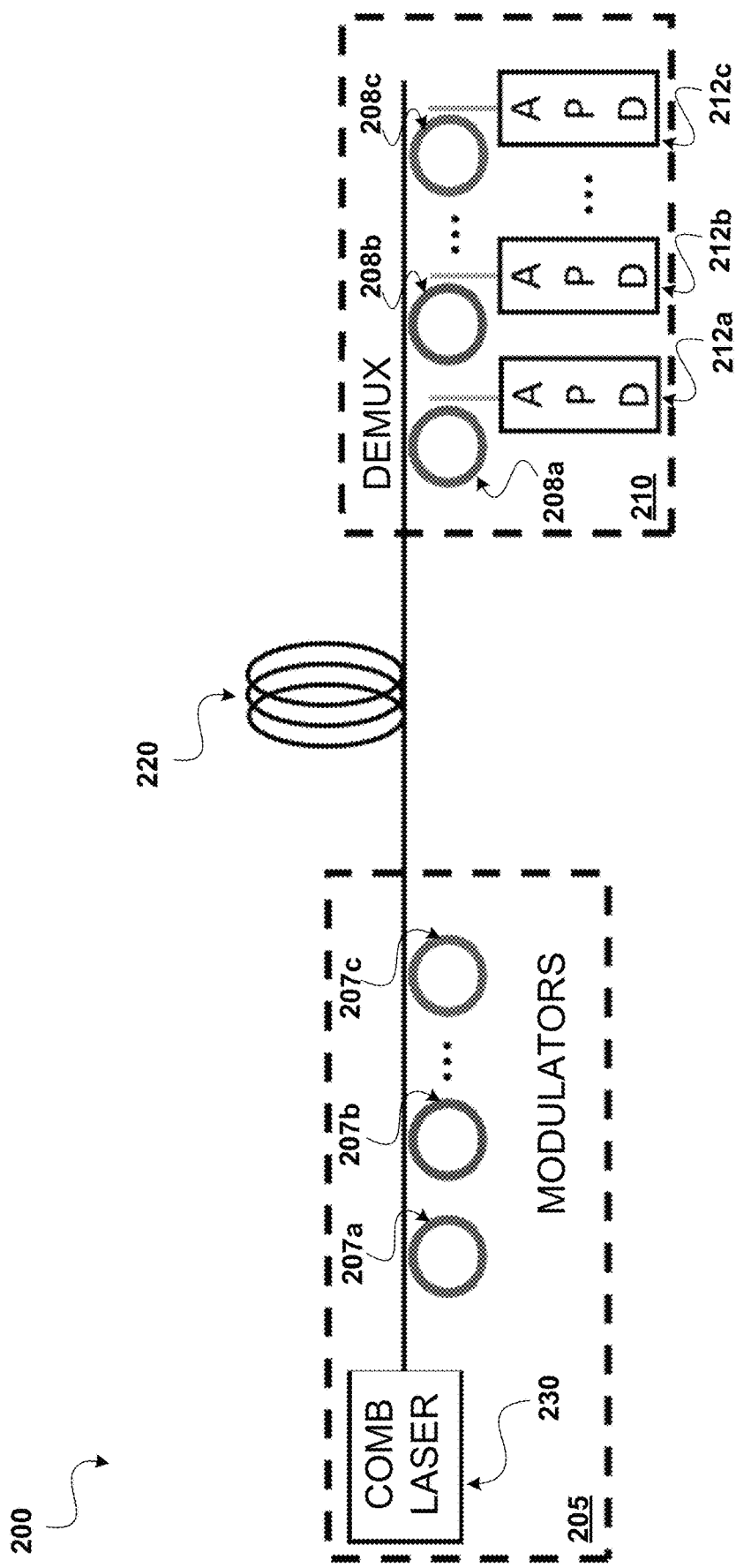
FIG. 2A is a diagram of an example of a Dense Wavelength Division Multiplexing (DWDM) silicon photonics optical system, according to some embodiments.

In FIG. 2A, a diagram of a DWDM system 200 is illustrated, serving as an example of a system that can utilize a multi-wavelength laser configured with the disclosed stabilization features. The DWDM system 200 can include DWDM photonic interconnects based on silicon photonics. In general, FIG. 2A illustrates the system 200 as including an optical link 220 that is physically coupling an optical transmitter module (Tx) 205 for transmitting information modulated onto optical signals that are received by an optical receiver module (Rx) 210. Further, in the illustrated example, the optical transmitter module 205 includes a multi-wavelength laser, shown as comb laser 230, that produces light at various wavelengths for the optical signal. By implementing the comb laser 230 with the disclosed stabilization circuitry (shown in FIG. 1A), the laser 230 can self-adjust to compensate for temperature-induced drift and stabilize its lasing wavelengths.

Figure 2B:
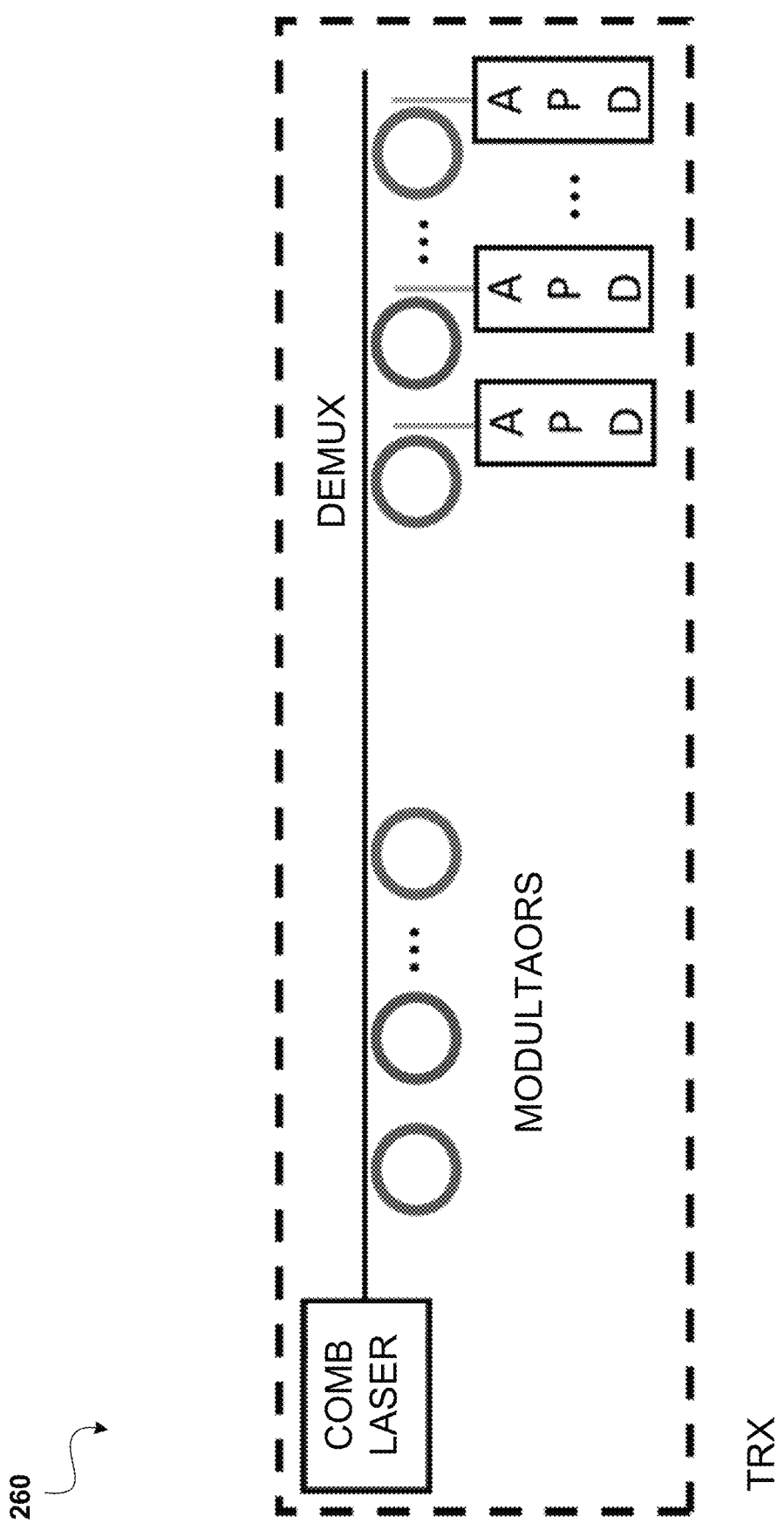
FIG. 2B is a diagram of another example of a DWDM silicon photonics optical system, according to some embodiments.

The optical transmitter 205 further includes several key components for transmitting an optical signal: the multi-wavelength light source, shown as comb laser 230; optical modulators, shown as several cascading silicon microrings 207a-207c. The optical receiver module 210 is shown to include several key components for receiving an optical signal: optical demultiplexer, shown as microring resonator filters 208a-208b; and photodetectors 212a-212c. As alluded to above, DWDM technology is widely used in fiber-optic telecommunications to increase the system capacity (e.g., without replacing existing backbone optic network). A mechanism for increasing capacity can be using a multi-wavelength light source at the optical transmitter module 205, for instance comb laser 230. The optical transmitter module 205 can multiplex N independent data streams, serialize them, and modulate them onto N different wavelengths $\lambda_1 \ldots \lambda_N$ of light, typically having 50 GhZ-100 GHz of channel spacing. For example, mirroring resonator 207a can be set to have a resonance wavelength $\lambda_1$, microring resonator 207b set to wavelength $\lambda_2$, and microring resonator set to wavelength $\lambda_N$. These data streams generated by the optical transmitter module 205 can then be sent together and propagated through an optical fiber 220, such as an optical cable, for a long distance (e.g., kilometers). Subsequently, at the optical receiver module 210 the optical demultiplexer can include micoring filters that are tuned for the N corresponding wavelengths, namely $\lambda 1 \ldots \lambda N$. As seen in FIG. 2A, the optical demultiplxer can be implemented as multiple microring filters 208a-208c that can be used to demultiplex the optical signal at a corresponding wavelength. For example, mirroring filter 208a can be set to filter wavelength $\lambda_1$, microring filter 208b can be set to wavelength $\lambda_2$, and microring filter can be set to wavelength $\lambda_N$. A compact and scalable DWDM photonic link can be implemented by using cascading silicon microring resonators to implement the modulator 207a-207c (at the Tx-end) and the filters 208a-208c (at the Rx-end) with slightly different radii to a single waveguide. In addition, the optical receiver 110 includes a series of photodetectors 212a-212c, where each photodetector 212a-212c is correspondingly connected to a respective microring filter. SiGe APDs can be used as photodetectors 212a-212c. The microring resonator filters 208a-208c and the photodetectors 212a-212c can serve as the de-multiplexer and de-serializer to convert the multi-wavelength serialized optical signals back to N independent electrical data streams simultaneously. It should be appreciated that the DWDM system 200 can be implemented using either an interchip optical link as shown in FIG. 2A, or an intrachip optical link, which is shown in FIG. 2B.

In order to realize chip-scale DWDM nanophotonic interconnects for the system 200, the use of microring resonators offers multiple advantages, such as a small footprint (e.g., 10 μm in diameter) and low driving power. As shown in FIG. 2A, microring resonators can be configured to implement both the optical modulator 207a-207c at the Tx-side 205 and the optical filters 208a-208c at the Rx-side 210. However, silicon microring resonators have a resonance wavelength λ dependence. Thus, stabilizing the wavelengths that are output by a multi-wavelength light source is imperative to proper function of the microring resonators, and in turn, the optical modulator and demultiplexer in the system.

Figure 3A:
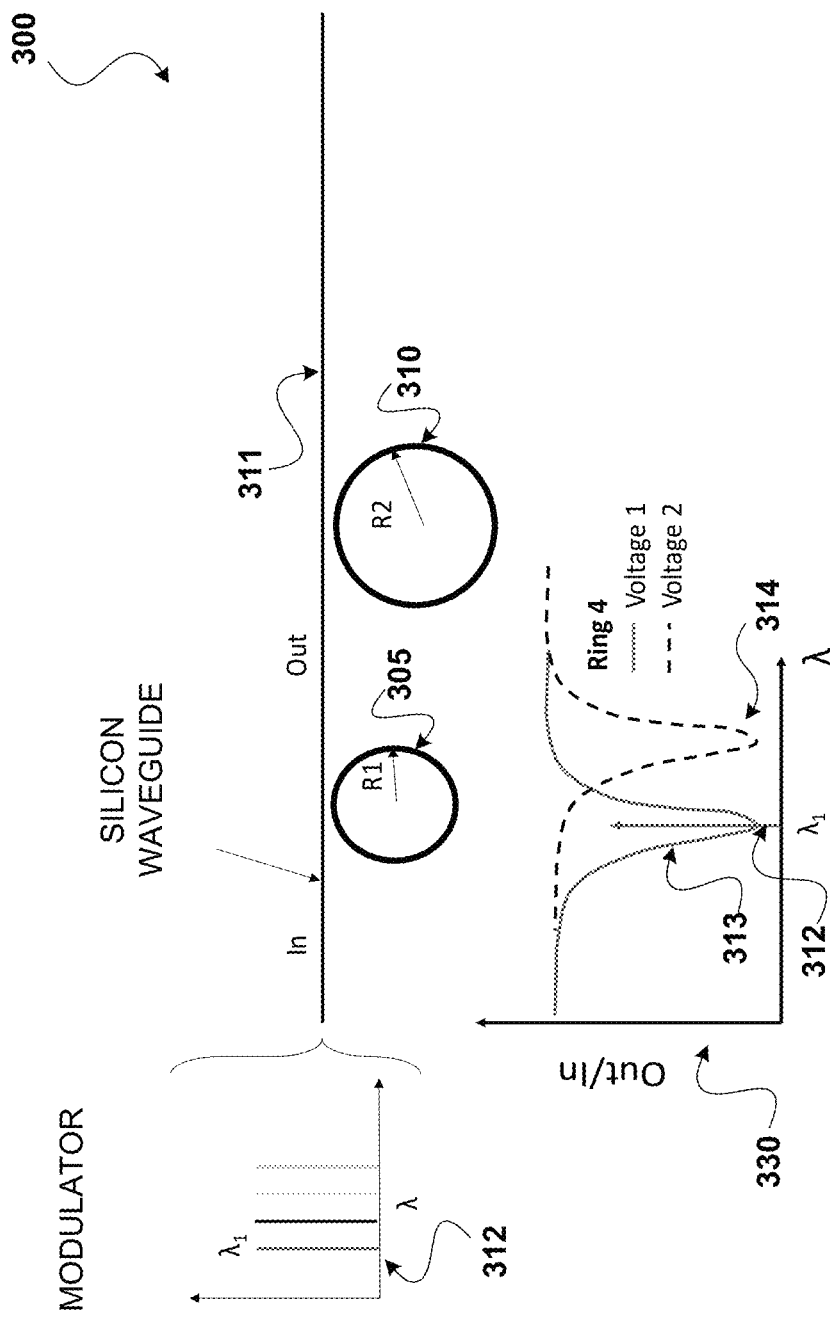
FIG. 3A is a diagram illustrating the relationship between microring modulators, voltage, and a shift in resonance wavelength, including a graphical representation of output/input of the microring resonator as a function of wavelength.

For example, FIG. 3A illustrates microring resonators 305, 310 that may be used to implement an optical modulator (e.g., at a transmission module shown in FIG. 2A). The microring resonators 305, 310 have a circular, or primarily annular, structure, having different radii. As shown, microring resonator 305 has a smaller radius (R1) as compared to microring resonator 310 with a larger radius (R2). The microring resonators 305, 310 are coupled to a bus silicon (Si) waveguide 311 having a primarily linear (e.g., straight) geometric shape. The bus silicon waveguide 311 can serve as an input waveguide that inputs the optical signal into the microring resonators 305, 310 (e.g., via evanescent coupling). In the illustrated example of FIG. 3A, light at four distinct wavelengths (represented by lines having different shades) can be input into the silicon bus waveguide 311, including a wavelength $\lambda_1$ 312. Additionally, the spectrum shows power as a function of the wavelength. In the example of a comb laser (shown in FIG. 2A), each wavelength can be output from a comb line of the laser, and a microring resonator can correspond to each individual comb line. Then, the microring resonator can encode at each of the wavelengths. Referring to the example in FIG. 3A, microring resonator 305 can be configured to particularly encode data onto wavelength $\lambda_1$ 312. Each microring encodes data onto its respective wavelength, and its function is not impacted by the other wavelengths that may be received as input. For instance, microring resonator 305 particularly receives wavelength $\lambda_1$ 312, and does not see the other three of the multiple wavelengths output from the comb laser. Accordingly, microring resonator 305 will only encode data onto wavelength $\lambda_1$ 312, and does not manipulate the other wavelengths.

Microrings resonators, such as microring 305, have a transmission spectrum. Graph 330 in FIG. 3A represents output/input (on the y-axis) of the microring resonator 305 as a function of wavelength (x-axis). The curve 313 can be described as a generally flat line across several different wavelengths. However, at a specific wavelength, namely wavelength 312, the microring resonator 305 absorbs the light. This absorption of light is represented by the dip in the curve 313, having a vertex of the parabolic curve at wavelength $\lambda_1$ 312. As a result of the absorption, the light will not get transmitted by the microring resonator at that wavelength, which serves as the resonance wavelength of the mirroring. In other words, the microring resonator 305 has a wavelength resonance at wavelength λ1, in the example.

A characteristic of transmission spectrum, is its voltage dependence. Further, voltage dependency is an underlying principle of blue shift. That is, voltage (or current) can be injected into the ring to cause the resonance wavelength of a microring resonator to be shifted. As an example, by applying a voltage to the silicon microring, the resonance can be shifted to either a higher (e.g., right) or lower (e.g., left) wavelength, prior to encoding the data. Referring to the graph 330, at a first voltage (voltage 1), the resonance wavelength of microring resonator 305 is maintained, and light does not get transmitted at wavelength $\lambda_1$ 312. However, if a voltage is applied, shown as a second voltage (voltage 2) then the resonance of the microring shifts (represented by the dashed line) to a new curve 314. This concept serves as an underlying principle regarding wavelength shift in a laser, and further for the compensation techniques disclosed herein.

Figure 3B:
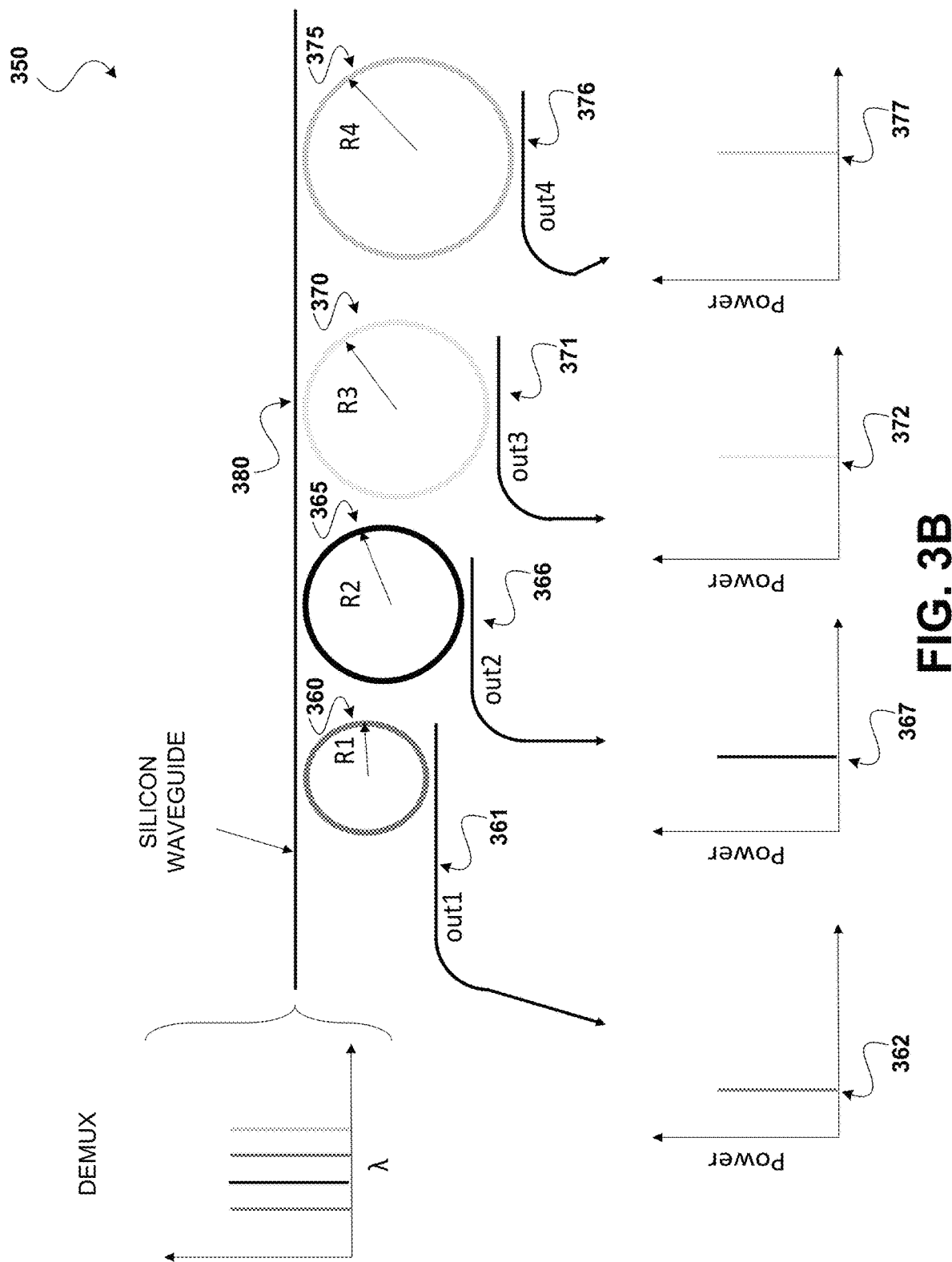
FIG. 3B is a diagram illustrating the operation of microring filters, for example in a DWDM silicon photonics optical system, receiving multiple wavelengths.

Referring now to FIG. 3B, examples of microring filters 360, 365, 370, 375 that may be used to implement an optical demultiplexer (e.g., at a receiver module shown in FIG. 2A) are shown. Generally, the microrings of the demultiplexer have a similar structure as the modulator (shown in FIG. 3A). That is, a linear silicon bus waveguide 380 can be used to input light received by the demultiplexer to each of the cascading microring filters 360, 365, 370, 375. Additionally, FIG. 3B serves to illustrate that each of the microring filters 360, 365, 370, 375 acts on a particular wavelength. For example, each of the microring filters 360, 365, 370, 375 have a distinct radius, where the slight difference in radius impacts its corresponding resonance wavelength. In the example, microring 360 has a radius (R1) and filters at wavelength 362, microring 365 has a radius (R2) and filters at wavelength 367, microring 370 has a radius (R3) and filters at wavelength 372, and microring 375 has a radius (R4) and filters at wavelength 377. Also, in FIG. 3B each of the four cascading microring filters 360, 365, 370, 375 has a color that is the same color of its corresponding wavelength. After each of the microring filters 360, 365, 370, 375, receives light at its particular wavelength, a filtered output is produced 361, 366, 371, and 376 respectively, converting the multi-wavelength optical signals back to independent electrical data streams (e.g., being received by photodetectors).

This wavelength-dependency of elements in the optical interconnect system, as illustrated in FIGS. 3A-3B, further emphasizes the significance of having wavelength stabilization at the light source. Temperature changes at the laser leads to changes in the lasing wavelength(s), and even further to changes in the resonance wavelengths of the ring modulators and demultiplexers. For example, when a microring resonator is tuned to a particular wavelength, and red shift is experienced at the laser, then there is the threat of an inconstancy between the resonance wavelength (based on the intended wavelength) and the actual wavelength of the emitted light. Contending with such unintended shift in the lasing wavelength(s) involves complex adjustments to the optical system, using conventional approaches. For example, an existing approach to address unintended wavelength shift requires tracking the temperature at the laser. Subsequently, the approach requires performing adjustments at both ends of the interconnect, tuning the modulators and demultiplexers to new wavelengths resulting from the shift. However, making changes to each microring resonator/filter can be cumbersome and complex. Moreover, the static nature of this approach is vulnerable to continuous shift, where any additional shift, requires addition adjustments. There is another existing approach, where a heatsink is implemented as the laser, in an attempt to transfer heat away from the laser and maintain a fixed temperature. Nonetheless, the heatsink approach is not efficient, and requires a large current flow which drives up power consumption.

In FIG. 5A, an example schematic of a laser 500 with enhanced stabilization, which can be fabricated using the disclosed materials, is shown. In some embodiments, the laser 500 is a multi-wavelength semiconductor laser. Particularly, FIG. 5A is a top view of the laser 500. In addition, FIG. 5B is a schematic of a cross-sectional view of the laser 500. As described above, a key feature of the laser 500 is its capability to compensate for temperature-induced wavelength shift, by charging the integrated MOS capacitor in manner that effectuates a complimentary wavelength shift.

FIGS. 5A-5B illustrate an embodiment where the diode of the laser can be used to implement the temperature sensor (e.g., laser shown in FIG. 1B). In particular, the schematic in FIG. 5A shows that the laser 500 can include: a quantum dot (QD) layer 520; a silicon layer waveguide 525; and an integrated MOS capacitor 515. The QD layer 520 can be considered the laser portion of the laser 500 (including the active region for generating light). Also, it should be understood that schematics show a portion of the stabilization circuitry that is described in reference to the optical transmitted in FIGS. 1A-1B, for instance. In particular, the schematics do not illustrate the feedback controller. A fundamental concept that is relevant to the design of semiconductor laser 500 is the capacitance properties that result from placing a dielectric between two semi-conductors. Since capacitance can be formed in this manner, the MOS capacitor 515 can similarly be formed by placing a capacitor dielectric between a III-V material (semi-conductive material) and a silicon (semi-conductive material) of the laser 500, for example during its fabrication.

The laser 500 can include a quantum dot (QD) layer 520. The QD layer 520 may be a mesa structure formed using various III-V semiconductor materials, such as gallium arsenide (GaAs). Other III-V semiconductor materials can also be used, such as InAs, InGaAs, InP, InGaP, InGaAsP, etc. The QD layer 520 can include an active region, which may be defined as the region of the laser 500 that generates light. Further, laser 500 include a silicon waveguide 525. The silicon waveguide 525 can be used to guide the propagation of light in the active region of the QD layer 520.

In FIG. 5B, the cross-sectional view, which prominently illustrates the multiple layers of materials that may be deposited on a substrate for fabricating the laser 500. In the illustrated example, layers 531, 532, and 533 may collectively make up a Silicon-On-Insulator (SOI) substrate. Layer 531 is a bottom silicon (Si) layer. Layer 532 is a buried oxide (BOX) layer, which can be formed from silicon dioxide ($SiO_2$). Also, there can be an upper silicon layer 533 in the SOI substrate. In some cases, a thin layer of a capacitor dielectric may be deposited on top of the upper silicon layer 533, which ultimately forms the MOS capacitor structure. As alluded to above, the thin dielectric layer may be comprise of oxide (or other dielectric) that is deposited between the lasing material, such as III-V material of layer 540, and silicon layer 533. For example, during fabrication, a dielectric layer can be deposited before the III-V material physically contacts the silicon layer 533. Thus, once these layers have been contacted, areas of direct contact between the III-V layer 540 and the silicon layer 533 form a MOS capacitor component that can be integrated into the laser 500.

As shown, the insulator layer 542 can be formed beneath the semiconductor contact layer 541 and the upper silicon layer 533. Furthermore, locations in the cross-sectional view that correspond to the QD layer 520 and the waveguide 525, as previously described (shown in FIG. 5A), are illustrated.

Furthermore, on top of the semiconductor contact layer 541, the III-V layer 540 can be formed using III-V material. In an example, the III-V layer 540 can be comprised of GaAs. Then, a cladding layer 545 may be deposited on top of the III-V layer 540. The cladding layer 545 may comprise AlGaAs. FIG. 5B shows an uppermost layer over the cladding layer 545, which can be a metal layer 546. The metal layer 546 may comprise any conductive material allowing it to serve as an electrode for laser 500. As an electrode, the metal layer 546 can be used to electrically inject electrical carriers that can be combined to generate light in the laser 500. Additionally, there are metal layers 547 and 548 that are shown on top of the semiconductor contact layer 541, at opposing ends.

According to the embodiments, a voltage (Vlas) can be applied to an electrode, namely the metal layer 546, for powering the laser 500 to generate light. Additionally, a voltage (Vcap) can be applied to another electrode, namely the metal layer 548. The voltage (Vcap) at the electrode corresponding to the integrated MOS capacitor (shown in FIG. 5A) is employed for engaging the MOS capacitor in a manner that compensates for unintended wavelength shift. For example, applying a first voltage (Vlas) to a first electrode (i.e., metal layer 546) of the laser 500 can charge carries of the quantum dots (within the active region of the laser). As a result, this first voltage (Vlas) causes the laser 500 to emit light at a particular lasing wavelength. Furthermore, by using the abovementioned compensation techniques, a particular voltage can be determined for effectuating a complimentary wavelength shift (e.g., blue shift) that negates any measured temperature-induced wavelength shift (e.g., red shift). Thus, to accomplish stabilization of the laser 500, a feedback controller (shown in FIG. 1A), for instance, can apply a second voltage (Vcap) to the second electrode (i.e., metal layer 547), where the second voltage (Vcap) is set to the determined voltage for appropriate blue shift. As a result, the application of (Vcap) to metal layer 547 causes the MOS capacitor to tune the actual lasing wavelength(s) (generated by applying to $V_{las}$) to target wavelength(s). Generally, as the second voltage ($V_{cap}$) increases, the MOS capacitor decreases the lasing wavelength. Therefore, when a significant temperature-induced wavelength shift is detected, the feedback controller of the stabilization circuitry (not shown) may apply a larger second voltage ($V_{cap}$) to the integrated MOS capacitor, which imparts a relatively large blue shift (reduced wavelength) to compensate. It should be appreciated that in some cases, the voltage (Vcap) may be used for various other aspects associated with the integrated MOS capacitor, such as enhancing mode locking.

Figure 6:
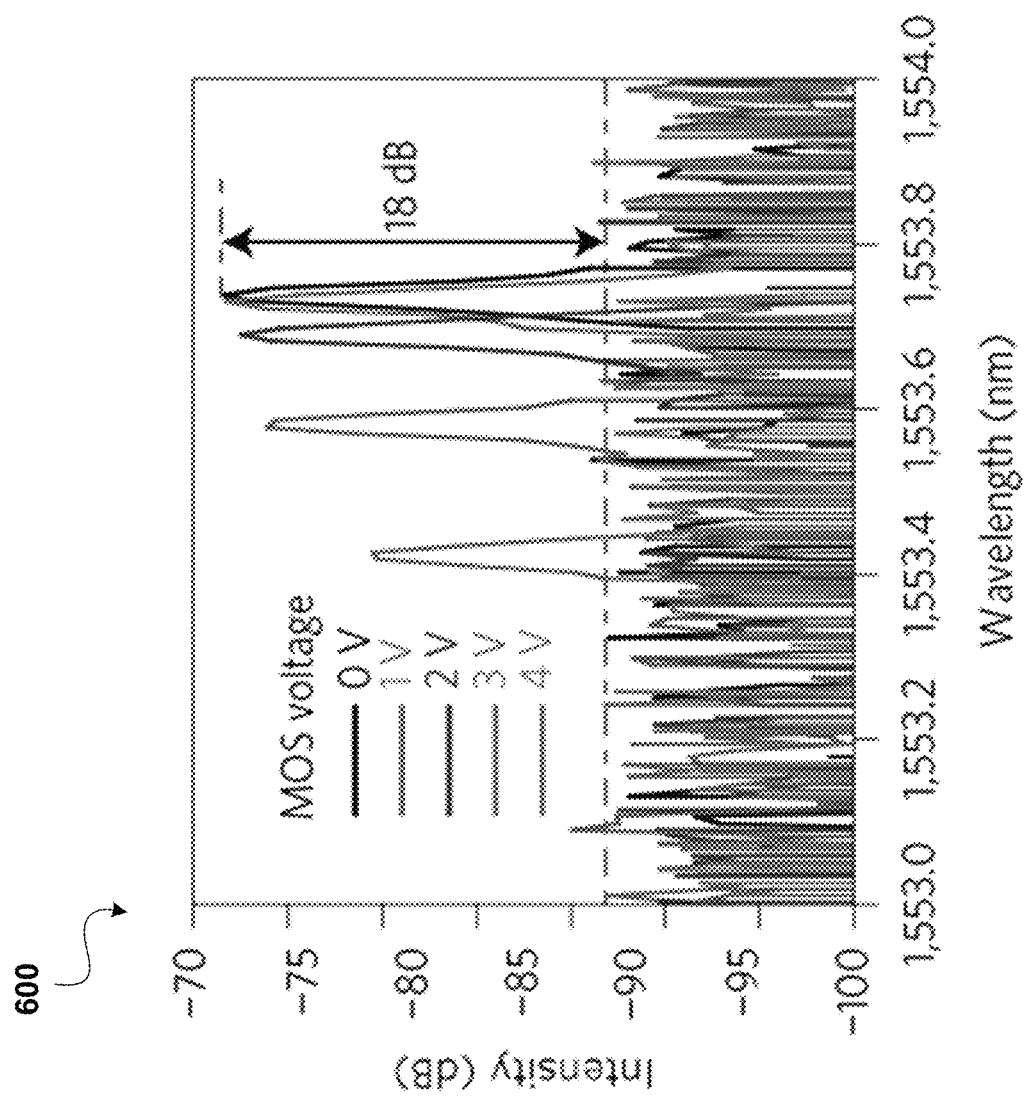
FIG. 6 is a graphical representation of intensity of a semiconductor laser as a function of wavelength, and further illustrating this relationship at varying voltages as applied to the integrated MOS capacitor.

In addition, the metal layer 549 can be placed on the upper silicon layer 533. In this configuration, the metal layer 548 can be an electrode for ground, while metal layer 549 serves as the electrode for applying the voltage ($V_{cap}$) to tune the MOS capacitor. FIG. 6 illustrates a graphical representation of the change in intensity (dB) of the laser, which may result from manipulating the MOS voltage. According to the embodiments, this characteristic of the integrated MOS capacitor is particularly leveraged to tune the laser for stabilization. Furthermore, a benefit of utilizing a MOS capacitor for implementing wave shift compensation its negligible current flow. As an example, applying a voltage ($V_{cap}$) to the MOS capacitor at the electrode of metal layer 549, for instance, tunes the lasing wavelength (to compensate for temperature-induced wavelength shift) without introducing an associated current flow. Due to this negligible current, the disclosed compensation techniques can realize improved efficiency.

FIGS. 7A-7B illustrate an embodiment that employs a resistor to implement the temperature sensor. In FIG. 7A, the laser 700 is shown to include an upper layer 705 forming a resistor 705, and a lower layer 710. The resistor 705 may be formed by doping semiconductor material that is in close proximity of the laser, for example as placed on a platform during fabrication. Alternatively, a separate material stack can be deposited for forming the resistor 705, for instance layers of resistive materials. Regarding the lower layer 710 of laser 700, the illustrated example includes substantially the same layers and elements as the lower layer shown in FIG. 5A. That is, lower layer 710, as illustrated in FIG. 7A, can include: a quantum dot (QD) layer 720; a silicon layer waveguide 725; and MOS capacitor 715. Further details regarding the materials and elements previously discussed above, are not described again in reference to FIG. 7B for purposes of brevity.

In FIG. 7B, a cross-sectional view of the schematic for the laser 700 is shown. Regarding the schematic for laser 700, the illustrated example includes substantially the same layers and elements as the schematic of FIG. 5B. Similar to the previous example, in FIG. 7B the schematic shows that layers of materials can include: bottom silicon (Si) layer 731; a BOX layer 732; upper silicon layer 733; a semiconductor contact layer 735; a III-V layer 740; a cladding layer 745; and metal layers 746, 747, 748. Further details regarding the materials and elements previously discussed above in reference to FIG. 5B are not described again in reference to FIG. 7B for purposes of brevity. In contrast, the example in FIG. 7B shows the resistor layer 745, which can be a layer of resistive material, such as a thin metal. As seen in FIG. 7B this resistor layer 745 can be formed on top of the BOX layer 732 and adjacent to the upper silicon layer 733. By using passive devices, such as a diode or a resistor (shown in FIG. 7B), to implement the temperature sensor, the circuitry can achieve stabilization for the laser using an "on-chip" solution. As alluded to above, an architecture which integrates the stabilization circuitry on-chip can realize various advantages, such as reduced costs, and small footprint.

Figure 8:
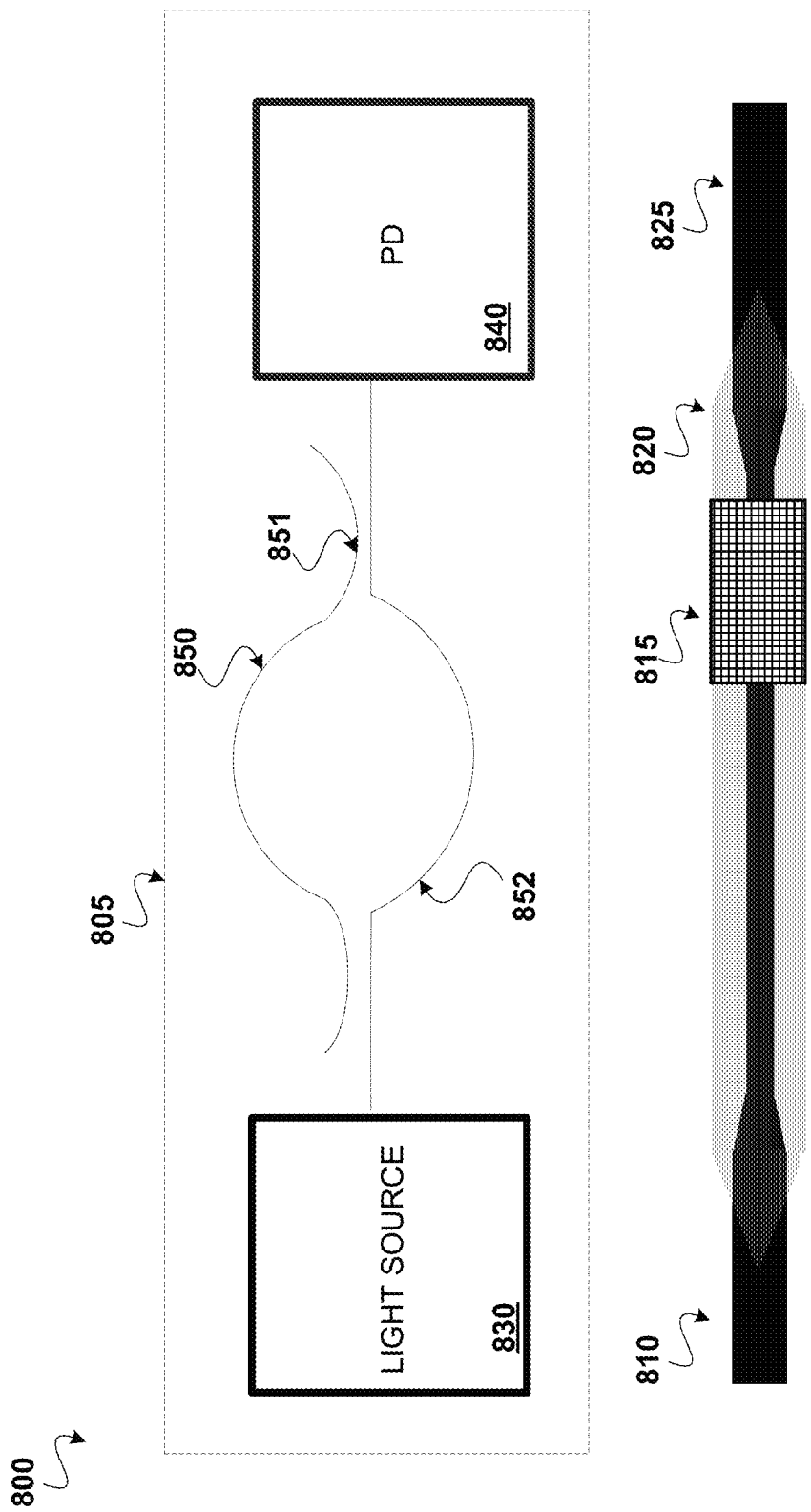
FIG. 8 illustrates another example of a semiconductor laser, for example the laser depicted in FIG. 1A, where the semiconductor laser includes a Mach-Zehnder interferometer (MZI) (e.g., temperature sensor) of the stabilization circuitry, according to some embodiments.

Regarding FIG. 8, another example of an "on-chip" temperature sensor implementation is shown. For instance, the temperature sensor can be realized an optical component that can be proximate to the laser being co-located on the same IC chip. FIG. 8 shows an example semiconductor laser 800, which comprises the temperature sensor portion 805, and the lasing portion 810. The temperature sensor portion 805 includes an optical-based sensor, namely an MZI in the particular example of FIG. 8. In an operational example, light from a light source 830 is launched into a the MZI 850, and the transmitted light is then measured by a photodetector (PD) 840. In some cases, the light source 830 can be implemented as a separate "on-chip" light emitting diode (LED).

As a general description, MZI 850 is a device used to determine the relative phase shift variations between two collimated beams derived by splitting light from a single source. The splitting of light can be caused by the distinct paths corresponding to each waveguide arm 851, 852 of the MZI 850. The two waveguide arms 851, 852 in the MZI 850 can have identical cross-sections and identical lengths, but one arm, waveguide arm 851 in the example, can be closer to the laser, shown as the lasing portion 810. As the laser heats up, a phase shift is introduced into the waveguide arm of the MZI that is closest to the laser, for instance waveguide arm 852. As a result, a rise in temperature at the laser 800 will impart a change in the detected power by the PD 840. For example, in instances when the PD 840 detects an increase in power (as compared to an earlier measurement), this can also be indicative of a measured increase in temperature at the laser 800. If the laser 800 is intended to operate between temperature T1 and T2, then the MZI should be designed in such a way that the phase shift at T1 and T2 are 0 and pi, respectively. Accordingly, the temperature sensor portion 805 can effectively detect, or otherwise measure, temperature at the laser 800 with respect to power measured by the MZI. As previously described, the feedback controller (not shown) can then use this measured temperature to determine a temperature-induced wavelength shift (e.g., red shift), and further determine a complimentary wavelength shift (e.g., blue shift) that compensates in manner that stabilizes the lasing wavelength.

Accordingly, the embodiments disclosed herein can realize stabilization circuitry and techniques for a semiconductor laser, which is a practical solution for "on-chip" laser implementations. That is, many existing optical interconnect systems implement the optical laser in a separate enclosure where the temperature is controlled. Nonetheless, the temperature control mechanisms designed for "off-chip" laser systems cannot be practically applied to highly integrated optical interconnects, such as "on-chip" laser implementations. For instance, heatsinking may not be suitable for a laser integrated on silicon chip (e.g., III-V on SOI) implementations. Moreover, implementing compensation at the laser itself, may be a more efficient than other approaches that to compensate for wavelength shift at multiple different components that are downstream in the optical interconnect system, such as the modulators and demultiplexers.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A circuit for stabilizing lasing wavelengths of a laser, comprising:
   laser circuitry generating a optical signal having at least one wavelength;
   temperature sensor circuitry measuring a signal indicative of an operational temperature of the laser circuitry;
   a metal-oxide semiconductor (MOS) capacitor integrated within the laser circuitry; and
   controller circuitry receiving the signal from the temperature sensor circuitry such that an operation temperature of the laser circuitry is determined and generating a control signal for tuning the MOS capacitor to compensate for a wavelength shift of the optical signal based on the determined operation temperature of the laser circuitry.

2. The circuit of claim 1, wherein the MOS capacitor is formed within the laser circuitry by deposited a capacitor dielectric between a III-V material and silicon.

3. The circuit of claim 2, wherein the MOS capacitor receives the control signal generated by the controller circuitry and tunes the laser circuitry to generate a shifted optical signal such that the wavelength shift of the multi-optical signal is compensated.

4. The circuit of claim 3, wherein the temperature sensor circuitry comprises a resistor proximal to the laser circuitry.

5. The circuit of claim 4, wherein the signal indicative of the operational temperature of the laser circuitry comprises a voltage across the resistor.

6. The circuit of claim 5, wherein the temperature sensor circuit comprises a diode.

7. The circuit of claim 6, wherein the diode is integrated proximal to the laser circuitry.

8. The circuit of claim 6, wherein the diode is integrated within the laser circuitry.

9. The circuit of claim 6, wherein the signal indicative of the operational temperature of the laser circuitry comprises a voltage signal across the diode.

10. The circuit of claim 6, wherein the temperature sensor circuit comprises:
    a light source;
    a Mach-Zehnder Interferometer (MZI) receiving light from the light source further transmitting the light; and
    a photodetector measuring power associated with the transmitted light from the MZI.

11. The circuitry of claim 10, wherein the signal indicative of the operational temperature of the laser circuitry comprises the power measured by the photodetector.

12. The circuitry of claim 3, wherein the controller determines a value of temperature-induced wavelength shift based on the measured temperature.

13. The circuitry of claim 12, wherein the control signal generated by the control circuitry comprises a voltage corresponding to the value of temperature-induced wavelength, and the voltage is applied to the MOS capacitor to effectuate a shift that decreases the wavelengths of the optical signal or that increases the wavelengths of the optical signal.

14. A multi-wavelength semiconductor laser with stabilization enhancements, comprising:
    a silicon-on-insulator (SOI) substrate layer;
    an upper silicon layer deposited on the SOI substrate layer;
    a III-V material layer deposited on the upper silicon layer forming an active region of a semiconductor laser to generate a multi-wavelength optical signal;
    a dielectric layer deposited between the III-V material layer and the upper silicon layer forming a MOS capacitor, wherein the MOS capacitor tunes the multi-wavelength optical signal for stabilization; and
    a temperature sensor layer deposited on the silicon substrate layer, wherein the temperature sensor measures a temperature that is indicative of a temperature-induced wavelength shift of the generated multi-wavelength optical signal.

15. The multi-wavelength semiconductor laser of claim 14, wherein the MOS capacitor tunes the multi-wavelength optical signal by effectuating a wavelength shift such that compensates for the indicated temperature-induced wavelength shift of the generated multi-wavelength optical signal.

16. The multi-wavelength semiconductor laser of claim 15, comprising:
    a cladding layer; and a metal layer deposited on the cladding layer receiving an applied voltage that charges the active region of the semiconductor laser to generate a multi-wavelength optical signal.

17. The multi-wavelength semiconductor laser of claim 16, comprising:
an additional metal layer deposited on the MOS capacitor receiving an additional applied voltage that charges the MOS capacitor to tune the multi-wavelength optical signal.

18. The multi-wavelength semiconductor laser of claim 14, wherein the temperature sensor layer comprises a silicon diode.

19. A method of stabilization lasing wavelengths of a semiconductor laser, comprising:
measuring a signal indicative of an operational temperature of the semiconductor laser during operation;
determining an operational temperature of the semiconductor laser during operation based on the measured signal;
determining a temperature-induced wavelength shift based on the measured operational temperature; and
generating a compensation signal to apply to an integrated MOS capacitor of the semiconductor laser to compensate for the temperature-induced wavelength shift of the multi-wavelength optical signal.

20. The method of claim 19, wherein the compensation signal comprises a voltage that is applied to the MOS capacitor to effectuate a shift that decreases the wavelengths of the optical signal or that increases the wavelengths of the optical signal.

* * * * *